United States Patent [19]
Arora et al.

[11] Patent Number: 5,999,010
[45] Date of Patent: Dec. 7, 1999

[54] METHOD OF MEASURING INTERCONNECT COUPLING CAPACITANCE IN AN IC CHIP

[75] Inventors: Narain D. Arora; Jian Wang, both of San Jose, Calif.

[73] Assignee: Simplex Solutions, Inc., Sunnyvale, Calif.

[21] Appl. No.: 08/984,492

[22] Filed: Dec. 8, 1997

[51] Int. Cl.$^6$ ............................. G01R 31/26; G01R 27/26
[52] U.S. Cl. ............................................. 324/765; 324/658
[58] Field of Search ..................................... 324/765, 519, 324/537, 719, 658, 686, 687, 679

[56] References Cited

U.S. PATENT DOCUMENTS

| | | | |
|---|---|---|---|
| 4,439,727 | 3/1984 | Boyle | 324/158 |
| 4,636,714 | 1/1987 | Allen | 324/60 CD |
| 4,638,341 | 1/1987 | Baier et al. | 357/15 |
| 4,831,325 | 5/1989 | Watson, Jr. | 324/678 |
| 5,212,454 | 5/1993 | Proebsting | 324/678 |
| 5,305,257 | 4/1994 | Aizaki | 365/149 |
| 5,446,674 | 8/1995 | Ikeda et al. | 364/489 |
| 5,466,956 | 11/1995 | Aeba | 257/203 |
| 5,519,327 | 5/1996 | Consiglio | 324/678 |
| 5,594,353 | 1/1997 | Hemphill | 324/681 |

OTHER PUBLICATIONS

"Efficient Extraction of Metal Parasitic Capacitances", by G.J. Gaston and I.G. Daniels, Proc. IEEE 1995 Int. Conference on Microelectronic Test Structures, vol. 8, Mar. 1995, pp. 157–160.

"Measurement and Characterization of Multi–Layered Interconnect Capacitance for Deep Submicron VLSI Technology", by Dae–Hung Cho, et al., Proc. IEEE 1997 Int. Conference on Microelectronic Test Structures, vol. 10, Mar. 1997, pp. 91–94.

"Investigation of Interconnect Capaitance Characterization Using Charge–Based Capacitance Measurement (CBCM) Technique and 3–D Simulation", by Dennis Sylvester, et al., Proc. IEEE 1997 Custom Integrated Circuits Conference, pp. 491–494. (Month Unavailable).

"An On–Chip, Interconnect Capacitance Characterization Method with Sub–Femto–Farad Resolution", by James C. Chen, et al., Proc.. IEEE 1997 Int. Conference on Microelectronic Test Structures, vol. 10, Mar. 1997, pp. 77–80.

"Use of Test Structures for Characterization and Modeling of Inter–and Intra–Layer Capacitances in a CMOS Process", by Pascal Nouet., IEEE Transactions on Semiconductor Manufacturing, vol. 10, No. 2, May 1997, pp. 1–9.

"On–Chip Capacitance Measurement Circuits in VSLI Structures", by Hiroshi Iwai, IEEE Transactions on Electron Devices, vol. ED–29, No. 10, Oct. 1982, pp. 1622–1626.

"VLSI Parasitic Capacitance Determination by Flux Tubes", by W. H. Dierking and J. D. Bastian, IEEE Mar. 1982, pp. 11–18.

"Capacitance Calculations in MOSFET VLSI", by M. I. Elmasry, IEEE Electron Device Letters, vol. EDL–3, No. 1, Jan. 1982.

*Primary Examiner*—Josie Ballato
*Assistant Examiner*—Russell M. Kobert
*Attorney, Agent, or Firm*—Paul B. Overhauser; Russell E. Fowler, II; Ice Miller Donadio & Ryan

[57] ABSTRACT

A method for measuring the coupling capacitance between two interconnect lines of an integrated circuit structure having a ground plane. The steps include shorting the first and second lines together and measuring a first capacitance (Ct) between the ground plane and the shorted first and second lines; eliminating the short between the first and second lines; shorting the first line to the ground plane and measuring a second capacitance (C1) between the second line and the shorted ground plane and first line; eliminating the short between the first line and the ground plane; shorting the second line to the ground plane and measuring a third capacitance (Cc) between the first line and the shorted ground plane and second line; and determining the coupling capacitance between the first line and the second line according to the formula Cc=(C1+C2−Ct)/2.

11 Claims, 1 Drawing Sheet

METHOD OF MEASURING INTERCONNECT COUPLING CAPACITANCE IN AN IC CHIP

FIELD OF THE INVENTION

This invention relates to the measurement of capacitances, and, in particular, to measurement of the coupling capacitance between interconnect lines in an integrated circuit ("IC") chip.

BACKGROUND OF THE INVENTION

Much of the emphasis in developing smaller and faster ICs has been on optimization and size reduction of transistor architecture. As the number of semiconductor devices designed on an IC chip has increased, so too has the number of interconnect lines on the chip. Thus as technology advances, multilevel interconnect lines ("MLIC") are spaced more closely together. While capacitance between MLIC has heretofore been insignificant from a design standpoint, as the number, length and concentration of MLIC increase, so does the effect of the capacitances between these lines, and its contribution to internal delays. More complex and higher performance circuits are restricted by the RC delay and the IR drop of MLIC. These so-called coupling capacitances, whether in the same plane (intra-level) or in different planes (inter-level), can cause crosstalk that results in functional failures of chip designs.

A large percentage of the MLIC in a modem IC chip are crossing lines (not parallel), which may have coupling capacitances between them of less than a few femtoFarads (fF). While IC computer aided design (CAD) software can theoretically predict the capacitance between such lines, available measurement devices are not sufficiently sensitive to measure capacitances of less than about 1 fF. Accordingly, it is difficult or impossible to verify the accuracy of CAD-predicted capacitances for many modern MLIC. This increases the time and expense of verifying the correct operation of a particular IC design.

As interconnect scales with each technology generation, several tradeoffs are made. In order to reduce line resistance and improve electromigration properties, metal thickness is kept fairly constant, and not scaled with pitch. The increasing aspect ratio (thickness/width) results in larger coupling capacitances and more crosstalk. This problem worsens as more metal layers are added with almost every generation. The performance gains of adding more metallization layers will eventually saturate; in other words, a limit exists for the number of metal layers feasible for integrated circuits. Once this limit is reached only tighter pitches in each layer will result in higher density, leading to larger capacitances again as reported by M. Bohr, "Interconnect Scaling—the real limiter to high performance ULSI," *IEEE Tech. Digest International Electron Devices Meeting*, pg. 241, 1995.

Credible optimization of chip designs and IC layouts require effective and reliable measurement of coupling capacitances so speed and noise of a proposed design can be considered. However, accurate measurement of coupling capacitance has been elusive. Capacitance is generally measured using a impedance meter ("LCR meter"). But the substrate in an IC chip is normally treated as a ground plane and as such the wire capacitance to the ground becomes a major part of the total wire capacitance. Additionally, this capacitance to ground is highly dependent on the presence or absence of neighboring wires. Furthermore, the coupling component can be a small fraction of the total wire capacitance. These factors, among others, have made accurate measurement of coupling capacitance difficult or impossible.

Coupling capacitances have been measured using so called test structures wherein a prototype chip having a desired wire configuration (but without all final semiconductor devices) of an IC chip is manufactured. There are two types of test structures that are normally used to measure interconnect coupling capacitances, the off-chip or passive test structures and the on-chip or active test structures. The passive test structures are laid out with very large geometries and the capacitance is measured directly using an impedance meter. In this direct method, very large lines are used in order to increase capacitance values and hence method gives average value a of the capacitance over a large area. Unlike the off-chip method, the on-chip method uses active devices to apply currents to charge or discharge capacitances of the interconnect lines. In this method, capacitance is a derived quantity, obtained by measuring the capacitive currents, and hence this method is also called indirect method. Either an on-chip reference capacitor and/or measuring circuitry is used to measure the capacitance. The present methods of measuring coupling capacitance cannot measure the small coupling capacitances of the order encountered in modem IC technology.

One proposed direct method for measuring MLIC capacitances is proposed in D. Cho, "*Measurement and Characterization of Multi-Layerd Interconnect Capacitance for Deep Submicron VLSI Technology*," Proc. IEEE 1997 Int. Conference on Microelectronic Test Structures, Vol. 10, March 1997, which is hereby incorporated by reference. This technique requires manufacture of an IC test structure for the particular design, i.e., an IC chip having all interconnect lines, but in which the active devices are not included. However, in addition to the designed interconnect lines, extra testing ground lines that run between designed interconnect lines must be added for each line for which a capacitance measurement is desired. To measure the coupling capacitance between two interconnect lines, the two lines are variously shorted and capacitances between the shorted lines are measured with respect to ground. While all of these measurements are being taken, the extra lines immediately adjacent to and on each side of the lines being measured must be grounded. From the measured capacitances, additional calculations must be made to eliminate those portions of the measured capacitances that represent the IC pads, and to calculate the final capacitance. This technique has the shortcoming of requiring the manufacture of a test structure with extra ground lines that run between designed interconnect lines. Moreover, this technique is not reported to work for interconnect lines below 5,000 $\mu$m in length, and accordingly is unsuitable for modern IC lines, which can have lengths of less than 100 $\mu$m. Also this technique is not disclosed to be able to measure the capacitance between crossing lines, i.e., non-parallel lines on different layers.

As discussed, another approach to measuring capacitances is the use of active test structures. In such methods, either an on-chip reference capacitor and/or measuring circuitry is used to measure the currents from which the coupling capacitance is derived.

For example, J. Chen, "*An On-Chip, Interconnect Capacitance Characterization Method with Sub-Femto-Farad Resolution*," Proc. IEEE 1977 Int. Conference on Microelectronic Test Structures, Vo. 10, March 1997, and "*Investigation of Interconnect Capacitance Characterization using Charge-Based Capacitance Measurement (CBCM) Technique and 3-D Simulation*," IEEE 1977 Custom Integrated Circuits Conference 1997 ("Chen"), disclose an active test structure for measuring coupling capacitances. Chen applies voltage pulses to dual Field Effect Transistors ("FET"s), set on both sides of two MLIC configurations such that the desired coupling capacitance is calculated from the measured average currents flowing through the configurations. However, Chen is a two-step, two-configuration method and test structure—which is inaccurate. Moreover, the wiring geometry is different for each MLIC configuration (i.e., parallel, crossing, etc.) for which a capacitance measurement is desired. In particular, Chen's incorporation of an additional MLIC into its second configuration actually changes the capacitance which was determined from the first configuration. In other words, the capacitance that is determined for the first configuration, and then factored into the determination of the a desired coupling capacitance, is inaccurate.

OBJECTS OF THE INVENTION

One object of the invention is to provide a technique for measuring sub-fF interconnect line coupling capacitances.

Another object of the invention is to provide a technique for measuring interconnect line coupling capacitances for lines less than 300 μm or even 100 μm in length.

Another object of the invention is to provide a technique for measuring interconnect line coupling capacitances of a test structure that does not require the test structure to have ground lines immediately adjacent to and on each side of the lines for which the interconnect coupling capacitance will be measured.

Another object of the invention is to provide a technique for measuring interconnect line coupling capacitances for which the capacitance between any two lines can be derived by the same formula regardless of whether the first line is parallel, non-parallel or on a different plane from the second line.

Another object of the invention is to provide a simple and efficient system for measuring interconnect line coupling capacitances which lends itself to implementation by test equipment to automatically thereby measure the capacitances between multiple pairs of lines in an integrated circuit structure.

Another object of the invention is to accurately measure any MLIC coupling capacitance in an IC chip in five or less steps.

Another object of the invention is accurately measure any MLIC coupling capacitances in an IC chip in such a way that the results are not affected by the number or geometrical configuration of conductors which neighbor any coupling capacitance that is being measured.

Another object of the invention is to accurately measure any MLIC coupling capacitance in an IC chip using a simple, compact, and inexpensive test structure, a voltage pulse generator, and a current meter.

SUMMARY OF THE INVENTION

The invention comprises a method for measuring the coupling capacitance between two lines of an integrated circuit structure having a ground plane. The steps include shorting the first and second lines together and measuring a first capacitance (Ct) between the ground plane and the shorted first and second lines; eliminating the short between the first and second lines; shorting the first line to the ground plane and measuring a second capacitance (C1) between the second line and the shorted ground plane and first line; eliminating the short between the first line and the ground plane; shorting the second line to the ground plane and measuring a third capacitance (C2) between the first line and the shorted ground plane and second line; and determining the coupling capacitance (Cc) between the first line and the second lines according to the formula Cc=(C1+C2−Ct)/2.

DETAILED DESCRIPTION

One embodiment of the present invention relates to an IC test structure and method for on-chip measurement of integrated circuit coupling capacitances which is comprised of an electronic switch, such as a p-channel FET (14), (16), and (18) on one side of each of three wiring configurations for which a capacitance is to be measured and another electronic switch, such as an n-channel FET (15), (17), and (19) on the other side of each wiring configuration, such that in the first configuration the wires for which the coupling capacitance is to be determined are shorted together (FIG. 3), in the second configuration the first the wire is grounded (FIG. 4), and in the third configuration the second wire is grounded (FIG. 5), and such that voltage pulses are applied via the electronic switches to each of the wiring configurations and the average current flowing through each wiring configurations is measured with a current meter, the capacitances of each wiring configuration are calculated from the measured currents, and the coupling capacitance between the two wires is calculated from the capacitances of the wiring configurations. The test structure would normally comprise the layers and wires of an IC chip under design, but need not include the complete circuits anticipated to be manufactured on the IC chip. Instead, for each line for which the capacitance will be measured, lines and layers of IC chip would be manufactured with the FETs as described above.

Figure 3:
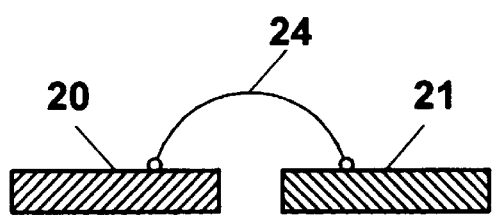
FIG. 3 shows one step in measuring the capacitance between two lines in which the lines are shorted and the capacitance of the resulting structure is measured with respect to ground.
Figure 4:
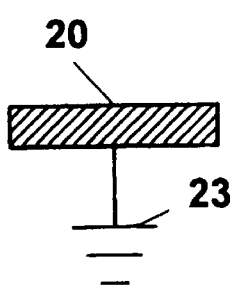
FIG. 4 shows another step in measuring the capacitance between two lines in which the first line is shorted to ground and the capacitance of the resulting structure is measured with respect to ground.
Figure 5:
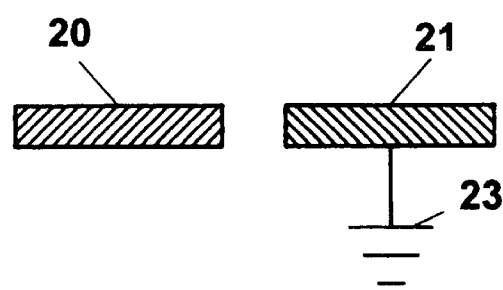
FIG. 5 shows another step in measuring the capacitance between two lines in which the second line is shorted to ground and the capacitance of the resulting structure is measured with respect to ground.

As shown in FIG. 3, when the first wire (20) and second wire (21) are shorted together via jumper (24), the capacitance is measured with respect to ground (23) yielding Ct. Next, as shown in FIG. 4, the first wire (20) is shorted to ground (23) and the capacitance of the combination is measured with respect to second wire (21), yielding C1. Finally, as shown in FIG. 5, the second wire (21) is shorted to ground (23) and the capacitance of the combination is measured with respect to first wire (20), yielding C2. The coupling capacitance between first wire (20) and second wire (21), Cc, is calculated according to the formula Cc=(C1+C2−Ct)/2.

The geometrical configuration of the MLIC is irrelevent to the calculation of Cc, but it must be kept identical for all three measurements.

Figure 1:
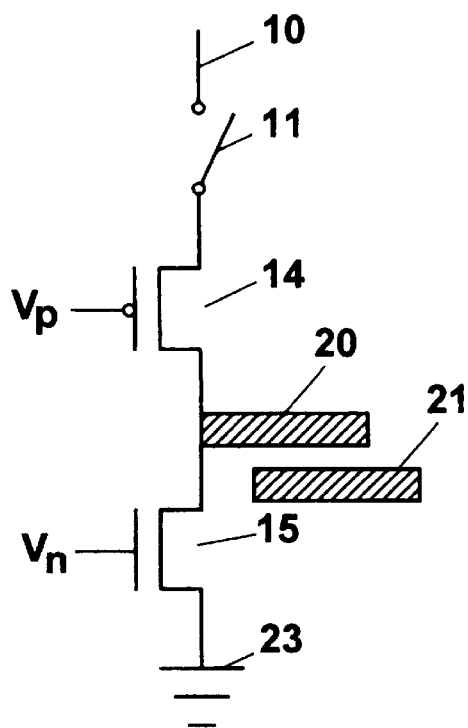
FIG. 1 shows two interconnect lines of an IC structure, the capacitance between which is to be measured, and electronic switches for applying voltage pulses to the lines.
Figure 2:
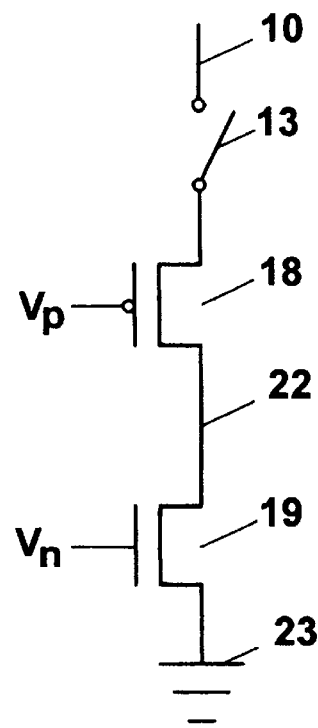
FIG. 2 shows the direct connection of two electronic switches of the same type as those is of FIG. 1.

Accordingly, this invention uses on-chip method to measure the capacitance of different MLIC configurations. Two separate pulses, Vp and Vn, are applied to the p-channel (14), (16), and (18) and n-channel (15), (17), and (19) transistors and the resulting average current measured for each structure. The measured current, I, is proportional to the corresponding capacitance of each structure, C, and is given by I=CVf, where V is the applied DC voltage and f is the frequency of the input pulse. Thus, measuring the current (I) through the structure allows the corresponding C to be calculated. The fourth inverter (FIG. 2), without any structure, provides the leakage current that corresponds to the minimum capacitance the system can measure. The theory behind the calculation of Cc is as follows:

For a system of two conductors i and j. The capacitance matrix is $$\begin{bmatrix} C_{ii} & -C_{ii} \\ -C_{ji} & C_{jj} \end{bmatrix} \quad \text{(EQ 1)}$$

where $C_{ii}$ and $C_{jj}$ are the total capacitances of i and j, and $C_{ij}=C_{ji}$ are the coupling capacitance. If $C_{ig}$ and $C_{jg}$ are the capacitances of i and j to the ground, then $C_{ii}=C_{ig}+C_{ij}$ and $C_{jj}=C_{jg}+C_{ij}$. If the two conductors are connected to form a conductor called t, their resulting total capacitance is equal to the capacitance to the ground; i.e. $C_{tt}=C_{tg}$. Connecting the two conductors is equivalent to setting both conductors at an equal voltage, V. At this voltage, when the conductor pair is considered as one conductor (connected), the total charge is given by $$Q=C_{tt}V \quad \text{(EQ 2)}$$

or, if we treat them as separated yet with the same voltage $$Q=Q_i+Q_j=(C_{ii}+C_{jj}-2C_{ij})V \quad \text{(EQ 3)}$$

where $Q_i$ and $Q_j$ are the charge on the conductors i and j respectively. Therefore, $$C_{tt}=C_{ii}+C_{jj}-2C_{ij} \quad \text{(EQ 4)}$$

and $$C_{ij}=(C_{ii}+C_{jj}-C_{tt})/2 \quad \text{(EQ 5)}$$

where $C_{ij}$ is the coupling capacitance and is not affected by the geometrical configuration of the conductors or by neighboring conductors.

The capacitance measurements described above maybe taken using any conventional high sensitivity capacitance measurement instrumentation.

While one embodiment of the method for measuring interconnect coupling capacitance in an IC chip has been described in detail, it should be apparent that many modifications and variations thereto are possible, all of which fall within the true spirit and scope of the invention. For example, the steps could be performed manually or automated using computers or other special test equipment. Also, this invention could be used to determine the coupling capacitance between any two MLIC, any two groups of MLIC, or any other two structures in an IC chip, where either one or neither is an MLIC or group of MLIC. Also, this invention is suitable for virtually all IC chip technologies, including but not limited to LSI, VLSI, ULSI, CMOS, TTL, and ASICs. Although the resulting test structure need not include the complete circuits anticipated to be manufactured on the IC chip, circuits may be included when circuit specific results are desired. Furthermore, the FETs of the disclosed embodiment are simply electronic switches which may be replaced with other devices for the same function, it being appreciated that the accuracy of the capacitance measurement will be limited by the leakage of the switches. And the ground plane may be replaced with any suitable reference points which are brought to the same potential. Due to the simplicity of the calculations, existing capacitance measurement systems are easily modified to automatically perform the shorting and measuring steps, storing each capacitance measurement digitally, and calculating and displaying the final measurement as described above. Those of skill in the art will also appreciate that, if necessary, the formula for calculating the final capacitance may be adjusted to take into account, for example, excess capacitance of the probes of the measurement instrumentation and the leakage current of the electronic switch. Moreover, the instrumentation may be easily fitted with a number of probes equal to the number of lines in the IC structure to be tested, and provided with software and switches for automatically measuring the capacitance between every possible combination of lines in the IC structure. Moreover, these measurements may be automatically transmitted to a computer for comparison and display via software to CAD-generated projected capacitance measurements for the IC design.

What is claimed is:

1. A method for measuring the coupling capacitance between two lines of an integrated circuit structure, comprising:

providing an integrated circuit structure, the structure having
a first line, a second line and a ground plane shorting the first and second lines together and measuring a first capacitance (Ct) between the ground plane and the shorted first and second lines;

eliminating the short between the first and second lines;

shorting the first line to the ground plane and measuring a second capacitance (C1) between the second line and the shorted ground plane and first line;

eliminating the short between the first line and the ground plane;

shorting the second line to the ground plane and measuring a third capacitance (C2) between the first line and the shorted ground plane and second line;

determining the coupling capacitance (Cc) between the first line and the second line according to the formula Cc=(C1+C2−Ct)/2.

2. The method of claim 1 wherein:

the structure has no ground lines immediately adjacent to and on each side of either of the first and second lines.

3. The method of claim 1 wherein:

the first and second lines are in different horizontal planes of the integrated circuit.

4. The method of claim 3 wherein:

the first and second lines are parallel.

5. The method of claim 3 wherein:

the first and second lines are non-parallel.

6. The method of claim 1 wherein:

the structure further comprises
a first electronic switch connected between the first line and a first line capacitance measurement point, and a second electronic switch connected between the first line and ground;
a third electronic switch connected between the second line a second line capacitance measurement point, and a fourth electronic switch connected between the second line ground;

and wherein the first, second, third and fourth electronic switches are operable to facilitate capacitance measurements.

7. The method of claim 6 wherein the first, second, third and fourth electronic switches comprise active devices on the integrated circuit structure.

8. The method of claim 1 wherein the first and second lines are less than 300 $\mu$m in length.

9. The method of claim 8 wherein the first and second lines are less than 100 $\mu$m in length.

10. The method of claim 1 wherein the capacitance between the first and second lines is less than one femto-Farad.

11. The method of claim 1 wherein:

each measuring step comprises a substep of providing an electrical current to either the first or second lines and thereby inducing an electromagnetic flux between the first and second lines, and wherein the electromagnetic flux between the first and second lines is not shielded by a ground line located between the first and second lines.

\* \* \* \* \*